United States Patent
Cheng et al.

(10) Patent No.: US 9,711,478 B2
(45) Date of Patent: Jul. 18, 2017

(54) SEMICONDUCTOR DEVICE WITH AN ANTI-PAD PEELING STRUCTURE AND ASSOCIATED METHOD

(71) Applicant: TAIWAN SEMICONDUCTOR MANUFACTURING COMPANY LTD., Hsinchu (TW)

(72) Inventors: Chih-Kai Cheng, Hsinchu County (TW); Cheng-Chieh Hsieh, Tainan (TW); Shih-Wen Huang, Chiayi County (TW)

(73) Assignee: TAIWAN SEMICONDUCTOR MANUFACTURING COMPANY LTD., Hsinchu (TW)

( * ) Notice: Subject to any disclaimer, the term of this patent is extended or adjusted under 35 U.S.C. 154(b) by 0 days.

(21) Appl. No.: 14/886,521

(22) Filed: Oct. 19, 2015

(65) Prior Publication Data
US 2017/0110429 A1    Apr. 20, 2017

(51) Int. Cl.
*H01L 23/498* (2006.01)
*H01L 23/48* (2006.01)
*H01L 21/768* (2006.01)
*H01L 23/00* (2006.01)

(52) U.S. Cl.
CPC .......... *H01L 24/32* (2013.01); *H01L 21/7685* (2013.01); *H01L 21/76816* (2013.01); *H01L 21/76898* (2013.01); *H01L 24/08* (2013.01); H01L 2224/0221 (2013.01); H01L 2224/02166 (2013.01); H01L 2224/08054 (2013.01); H01L 2224/08059 (2013.01); H01L 2224/32113 (2013.01); *H01L 2924/01013* (2013.01); *H01L 2924/01029* (2013.01); *H01L 2924/35121* (2013.01)

(58) Field of Classification Search
CPC ............................................. H01L 2924/35121
See application file for complete search history.

(56) References Cited

U.S. PATENT DOCUMENTS

| | | | | |
|---|---|---|---|---|
| 6,734,090 B2 * | 5/2004 | Agarwala | ......... | H01L 21/76801 257/E21.576 |
| 6,838,769 B1 * | 1/2005 | Chittipeddi | ....... | H01L 21/76807 257/758 |
| 8,021,976 B2 * | 9/2011 | Lee | ......... | H01L 24/03 257/751 |
| 8,723,325 B2 * | 5/2014 | Chen | ........ | H01L 24/03 257/734 |
| 2002/0034871 A1 * | 3/2002 | Chittipeddi | ....... | H01L 21/76807 438/612 |

(Continued)

*Primary Examiner* — Michael Lebentritt
*Assistant Examiner* — Jordan Klein
(74) *Attorney, Agent, or Firm* — WPAT, P.C., Intellectual Property Attorneys; Anthony King

(57) ABSTRACT

A semiconductor device with an anti-pad peeling structure is disclosed. The semiconductor device includes: a semiconductor substrate including a Through Substrate Via (TSV); a dielectric layer on the semiconductor substrate and including a plurality of recesses therein; and a pad above the semiconductor substrate to cover a portion of the dielectric layer and extend to the recesses; wherein the pad extends to the plurality of recesses, and a plurality of contact points are confined in the recesses between the pad and the conductive layer, and each of the contact points is at least partially excluded from a boundary of the TSV when being seen from a top-down perspective.

19 Claims, 16 Drawing Sheets

(56) References Cited

U.S. PATENT DOCUMENTS

| | | | |
|---|---|---|---|
| 2003/0020163 A1* | 1/2003 | Hung | H01L 24/05 257/734 |
| 2006/0180938 A1* | 8/2006 | Kurihara | H01L 21/4853 257/773 |
| 2008/0122105 A1* | 5/2008 | Wu | H01L 24/03 257/773 |
| 2008/0303170 A1* | 12/2008 | Tanida | H01L 21/76898 257/774 |
| 2009/0015285 A1* | 1/2009 | Farooq | G01R 31/2853 324/762.03 |
| 2009/0212426 A1* | 8/2009 | Ishizeki | H01L 21/76816 257/737 |
| 2009/0256257 A1* | 10/2009 | Daubenspeck | H01L 23/53295 257/738 |
| 2009/0283903 A1* | 11/2009 | Park | H01L 24/03 257/737 |
| 2010/0032196 A1* | 2/2010 | Kaneko | H01L 21/4846 174/260 |
| 2010/0270686 A1* | 10/2010 | Nakao | H01L 21/7684 257/774 |
| 2013/0099383 A1* | 4/2013 | Meyer-Berg | H01L 23/5226 257/772 |
| 2013/0140690 A1* | 6/2013 | Lin | H01L 21/76898 257/737 |
| 2013/0181347 A1* | 7/2013 | Tsai | H01L 24/13 257/737 |
| 2013/0313722 A1* | 11/2013 | Hwang | H01L 23/49827 257/774 |
| 2014/0070375 A1* | 3/2014 | Grivna | H01L 23/481 257/621 |
| 2014/0203438 A1* | 7/2014 | Chen | H01L 24/05 257/761 |
| 2015/0014848 A1* | 1/2015 | Lin | H01L 24/81 257/737 |
| 2015/0228594 A1* | 8/2015 | Alvarado | H01L 24/06 257/737 |
| 2016/0005688 A1* | 1/2016 | Hirano | H01L 23/5226 257/774 |
| 2016/0049384 A1* | 2/2016 | Lu | H01L 21/76877 257/737 |

* cited by examiner

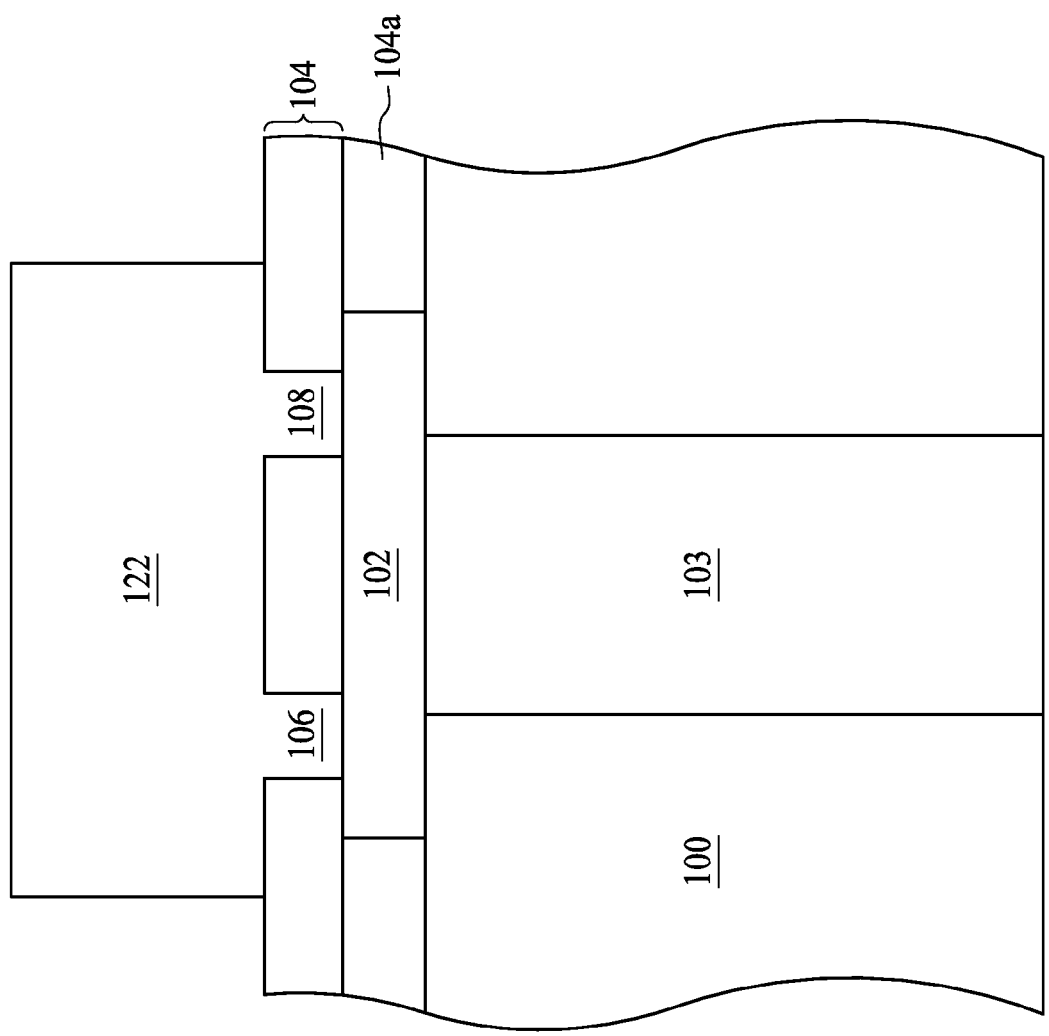

SEMICONDUCTOR DEVICE WITH AN ANTI-PAD PEELING STRUCTURE AND ASSOCIATED METHOD

BACKGROUND

Conductive pads of a semiconductor device are used as the connection interface between internal circuits of the semiconductor device and external circuits outside the semiconductor device. In modern semiconductor device packaging techniques, after a semiconductor device is formed on a wafer, the wafer has to be cut into dies. Subsequently, a die bonding process is carried out followed by a wire bonding process to electrically connect the external circuits and conductive pads of the semiconductor device with metal wires. Subsequently, a molding operation is carried out to complete the entire semiconductor device packaging process.

Typical conductive pads are usually in rectangular or square shapes. Hence, a high level stress may occur at corners of the conductive pads especially during the bonding process (or welding process). The stress may cause the conductive pads to peel and further damage the semiconductor device under the conductive pads.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
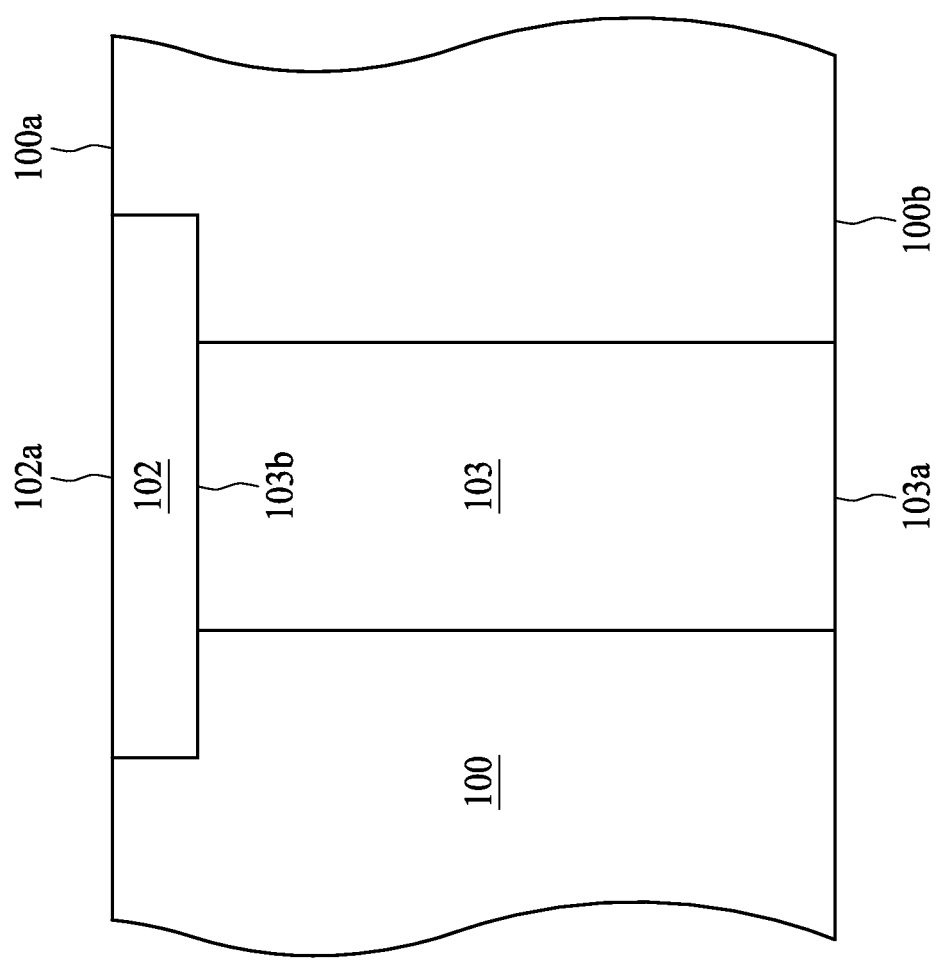
FIGS. 1-5 are cross-sectional schematic views for illustrating a flow for fabricating a semiconductor device with an anti-pad peeling structure according to an exemplary embodiment of the present disclosure.

The following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Notwithstanding that the numerical ranges and parameters setting forth the broad scope of the disclosure are approximations, the numerical values set forth in the specific examples are reported as precisely as possible. Any numerical value, however, inherently contains certain errors necessarily resulting from the standard deviation found in the respective testing measurements. Also, as used herein, the term "about" generally means within 10%, 5%, 1%, or 0.5% of a given value or range. Alternatively, the term "about" means within an acceptable standard error of the mean when considered by one of ordinary skill in the art. Other than in the operating/working examples, or unless otherwise expressly specified, all of the numerical ranges, amounts, values and percentages such as those for quantities of materials, durations of times, temperatures, operating conditions, ratios of amounts, and the likes thereof disclosed herein should be understood as modified in all instances by the term "about." Accordingly, unless indicated to the contrary, the numerical parameters set forth in the present disclosure and attached claims are approximations that can vary as desired. At the very least, each numerical parameter should at least be construed in light of the number of reported significant digits and by applying ordinary rounding techniques. Ranges can be expressed herein as from one endpoint to another endpoint or between two endpoints. All ranges disclosed herein are inclusive of the endpoints, unless specified otherwise.

FIGS. 1-5 are cross-sectional schematic views for illustrating a flow for fabricating a semiconductor device with an anti-pad peeling structure according to an exemplary embodiment of the present disclosure. Firstly, referring to FIG. 1, a semiconductor substrate 100 is provided in which an active circuit structure has been formed. The substrate 100 may include a bulk silicon substrate. Alternatively, the substrate 100 may be comprised of an elementary semiconductor, such as silicon or germanium in a crystalline structure; a compound semiconductor, such as silicon germanium, silicon carbide, gallium arsenic, gallium phosphide, indium phosphide, indium arsenide, and/or indium antimonide; or combinations thereof. In some embodiments, substrate may include a silicon-on-insulator (SOI) substrate. SOI substrates are fabricated using separation by implantation of oxygen (SIMOX), wafer bonding, and/or other suitable methods.

It should be appreciated that in order to simplify the drawing, only the conductive layer 102 of the active circuit structure is depicted in FIG. 1 in a rectangular shape, and not all of the devices in the active circuit structure are shown. It should be acknowledged by those skilled in the art that the active circuit structure includes, for example, a plurality of semiconductor components and a plurality of semiconductor metal interconnects. In the present disclosure, the conductive layer 102 represents a layer in the active circuit structure in the semiconductor substrate 100. The conductive layer 102 is exposed from a top surface 100a of the semiconductor substrate. The conductive layer 102 provides a surface 102a as an electrical contact terminal for any connection with a component external to the semiconductor substrate 100. In some embodiments, the conductive layer 102 is in an uppermost level of the active circuit structure.

The conductive layer 102 is preferably comprised of copper (Cu) and has a thickness of about 5 kilo angstroms (KA) to 10 KA. The conductive layer 102 is formed over and electrically connected to a Through Substrate Via (TSV) 103. The TSV 103 longitudinally passes through the semiconductor substrate 100. In this embodiment, the TSV is composed of a copper material or other materials having superior conductivity. Generally, a TSV is a vertical electrical connection, i.e. a via, passing completely through a silicon wafer or die. A TSV is a high performance interconnect technique used as an alternative to wire-bonding and flip chips to create 3D packages and 3D integrated circuits, compared to alternatives such as package-on-package for at least several reasons. One of the reasons is because the density of the vias can be designed to be higher than the contacts density of wire or ball grid bond fashion. Moreover, one of the reasons is the conductive path of the connections by vias can be designed to be shorter than either the wire or ball grid bond fashion. In a TSV 3D package (System in Package, Chip Stack MCM, etc.) containing two or more chips (integrated circuits), a substrate containing TSVs is used to connect multiple chips together in a package. A 3D integrated circuit (3D IC) is a single integrated circuit built by stacking silicon wafers and/or dies and interconnecting them vertically so that they behave as a single device. By using TSV technology, 3D ICs can acquire a great deal of functionality into a small "footprint." The different devices in the stack may be heterogeneous, e.g. combining CMOS logic, DRAM and III-V materials into a single IC. In addition, critical electrical paths through the device can be drastically shortened, leading to a faster operation speed.

The TSV 103 has two ends wherein one end 103a is exposed from an external surface 100b of the substrate 100. The external surface 100b is opposite to surface 100a. The exposed end 103a is designed to be connected to a component or circuit external to the substrate 100. The other end 103b, which is opposite to the end 103a, is in contact with the conductive layer 102. The TSV 103 and conductive layer 102 form a conductive path inside and through the substrate 100. Therefore, an electrical communication between any circuitry over surface 100a or any circuitry under surface 100b can be achieved. So as to make an interconnection in a 3D package.

Figure 2:
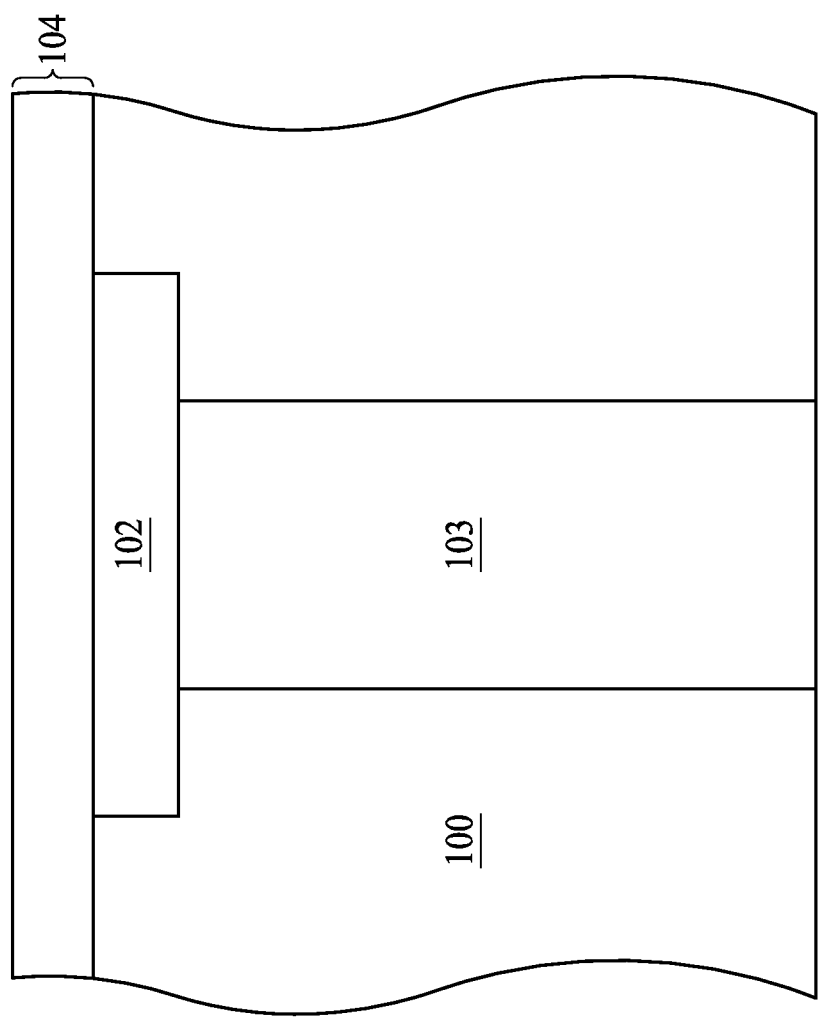

Referring to FIG. 2, a dielectric layer 104 is formed on the semiconductor substrate 100 and the conductive layer 102 by any suitable process. The dielectric layer 104 may be comprised of a dielectric material, such as silicon oxide, silicon nitride, silicon oxynitride, high-k dielectric material, other suitable dielectric material, and/or combinations thereof. Examples of high-k dielectric materials include HfO2, HfSiO, HfSiON, HfTaO, HfTiO, HfZrO, zirconium oxide, aluminum oxide, hafnium dioxide-alumina (HfO2-Al2O3) alloy, other suitable high-k dielectric materials, and/or combinations thereof. However, this is not a limitation of the present disclosure.

Figure 3:
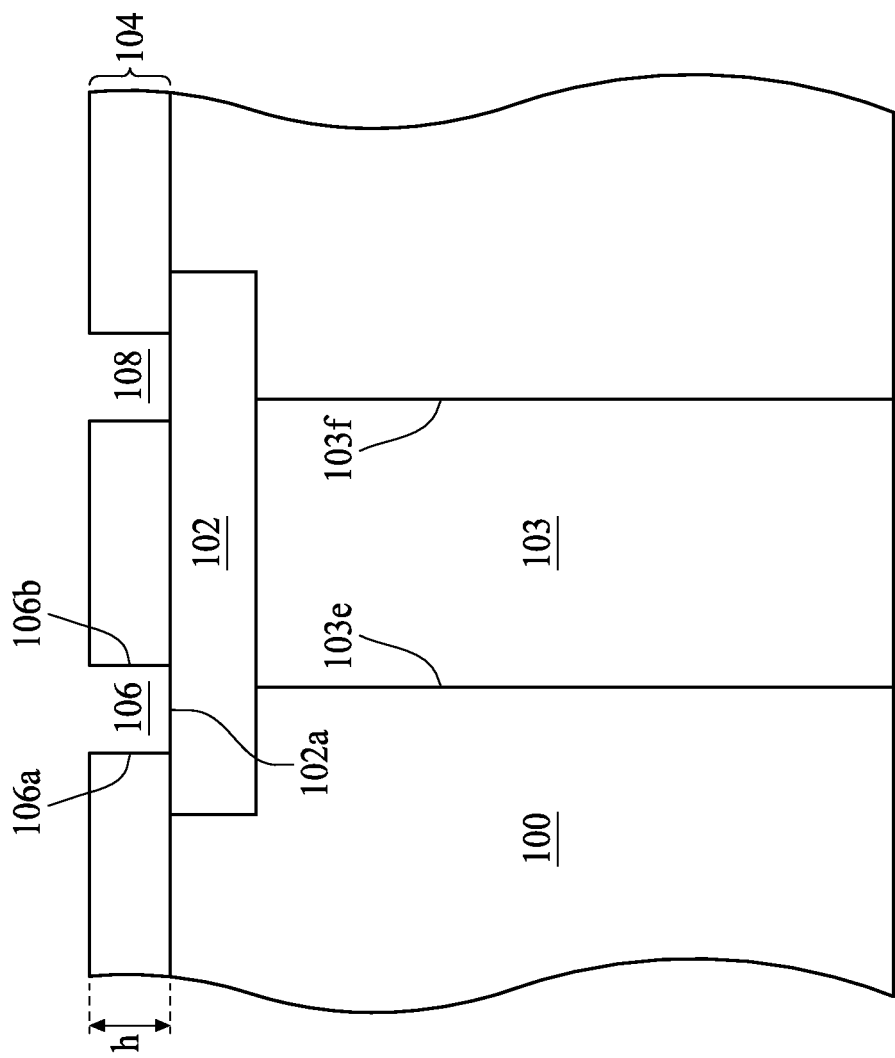

Recesses 106 and 108 are formed in the dielectric layer 104 as shown in FIG. 3. The recesses 106 and 108 are formed in the dielectric layer 104. Each recess has a depth h measured substantially along the longitudinal direction of the TSV 103. Due to some deviations during the manufacturing operations, there may be a slight variation between different recesses. However, each recess has a corresponding depth h greater enough to expose at least a portion of the surface 102a. The TSV 103 has at least one recess disposed above (two recesses in the subject embodiment) but the recess is partially overlapping with the underpaid TSV. Take recess 106 as an example, the recess 106 is over the TSV 103 but has a surface 106a laterally extruding over a sidewall 103e of the TSV 103. On the other side, the surface 106b of the recess 106 is overlaid the TSV 103 and laterally within the boundary of sidewall 103e. The recess 108 is positioned above an opposite sidewall 103f of the TSV 103 in a way similar to the recess 106.

Figure 6:
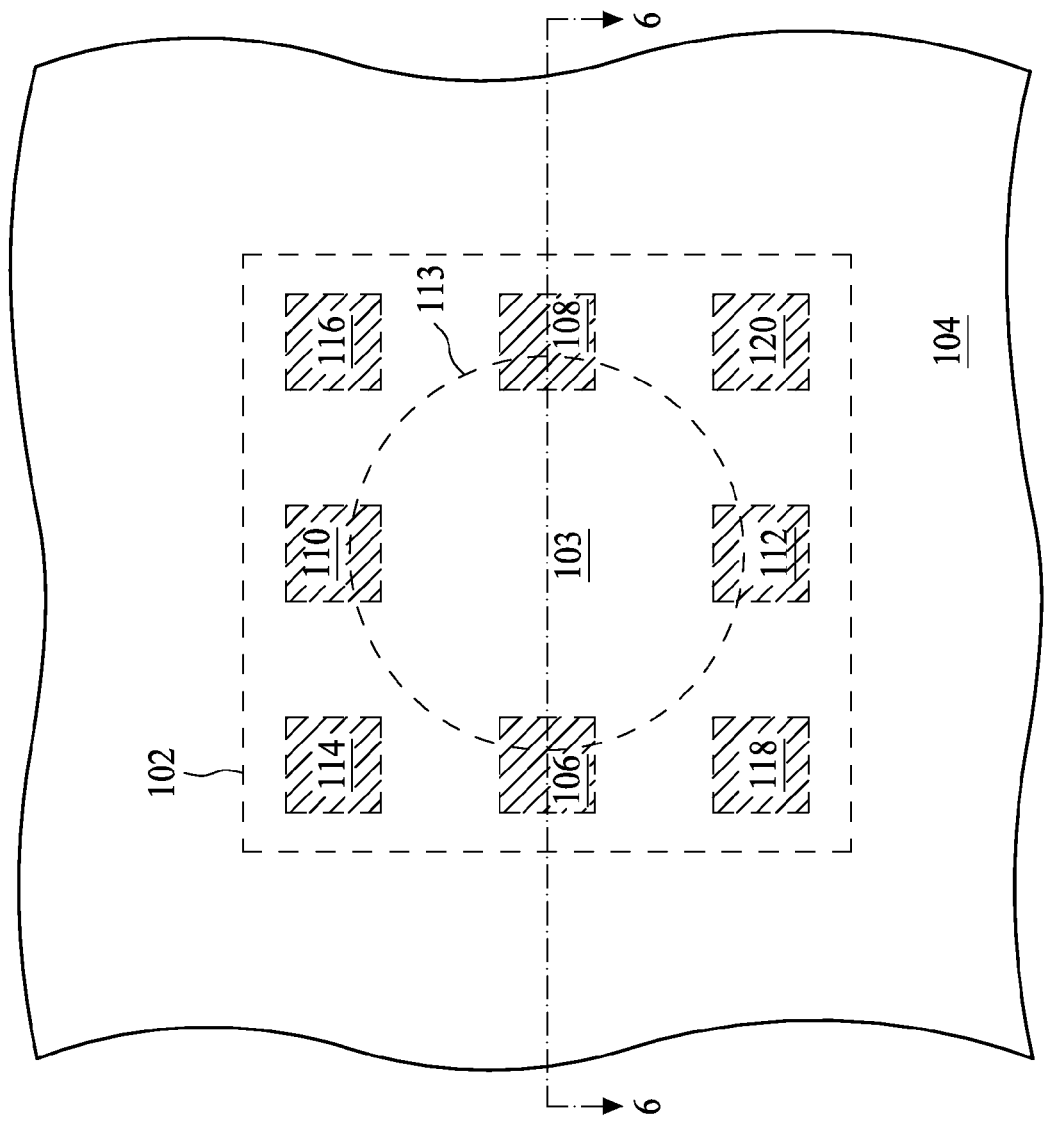
FIG. 6 is a schematic top view of FIG. 3 according to an exemplary embodiment of the present disclosure.

Still referring to FIG. 3 in conjunction with FIG. 6, FIG. 6 is a schematic top view of FIG. 3 according to an exemplary embodiment of the present disclosure. FIG. 3 is a cross-sectional schematic view of the semiconductor taken along lines 6-6 of FIG. 6. As shown in FIG. 6, the recesses 106, 108 and recesses 110-120 are substantially quadrilateral shaped, and a boundary 113 of the TSV 103 is approximately circular. Conductive layer 102 in the recesses is exposed (the shaded portion). The boundary 113 is depicted in a dotted line because it is covered by the conductive layer 102. Specifically, the recesses 106, 108, 110 and 112 are formed to be overlapped with a portion of the sidewall of the TSV 103. Recesses 114-120 are formed outside the boundary 113 of the TSV 103 and non-overlapped with the TSV 103 when being seen from the top view. Therefore, neither the partially overlapped recess (such as 106, or 108) nor the non-overlapped recess (such as 114, or 120) is formed fully inside the boundary 113.

The method of forming the recesses 106-120 is, for example, forming a patterned photoresist layer (not shown) on the dielectric layer 104 of FIG. 2. The pattern of the patterned photoresist layer exposes eight substantially quadrilateral shaped regions of the surface of the dielectric layer 104. Then, the patterned photoresist layer is used as a mask to etch the exposed dielectric layer 104. The etch stops at the conductive layer 102 and the formation of the recesses 106-120 is performed.

Please note that it is not intended for the invention to be limited to the examples shown herein. In some other embodiments, the recesses 106-120 of FIG. 6 may be in other types of shapes. For example, a shape of the recesses 106-120 may be polygon. In another example, a shape of the recesses 106-120 may be circular or oval.

Figure 4:
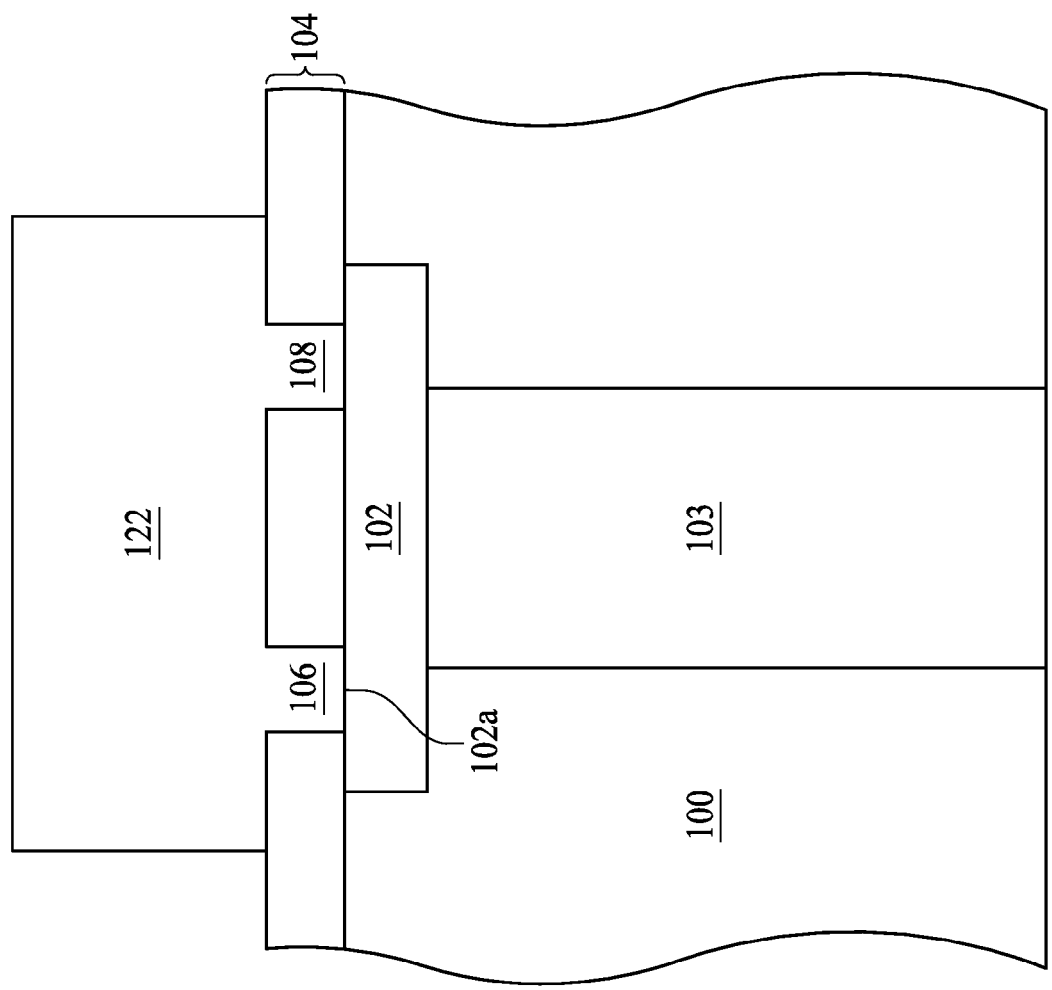

Referring to FIG. 4, a pad 122 is formed above the semiconductor substrate 100 to electrically connect the conductive layer 102. The pad 122 covers a portion of the dielectric layer 104 and extends to the recesses 106-120 (only recesses 106 and 108 are depicted in FIG. 4 due to the cross-sectional perspective). The pad 122 may fully or partially overlap the conductive layer 102 and the TSV 103. In this embodiment, the pad 122 completely covers the area of the TSV 103 when being seen from a top-down perspective. Please note that the pad 122 may fully or at least partially fills the recesses 106-120. In this embodiment, the pad 122 is a thick pad, for example, and the pad 122 has a thickness of about 20 KA (kilo angstrom) to about 40 KA. The pad 122 may include a metal layer comprised of, for example, aluminum (AL). The method of forming the pad 108 is, for example, forming an aluminum metal layer (not shown) above the semiconductor substrate 100, so as to cover the whole dielectric layer 104 and fill up the recesses 106-120. Then, a patterned photoresist layer (not shown) is formed on the aluminum metal layer, so as to expose the aluminum metal layer above the desired position approximately above of the corresponding conductive layer 102. Thereafter, the patterned photoresist layer is used as a mask to etch the exposed aluminum metal layer, thus completing the formation.

The portions of the pad 122 formed in the recesses 106-120 provide a contact to electrically connect to the conductive layer 102 through portions of the pad 122 in the recesses 106-120. The pad 122, conductive layer 102, and the TSV 103 together form a conductive path to convey electrical communication between components disposed over surface 100a or under surface 100b. The conductive path is a stacked structure and the arrangements of relative position can be various according to the stress interaction between the stacked layers. For example, as in FIG. 4, the pad 122 is arranged to be not fully in contact with the conductive layer 102. The contact points between the pad 122 and conductive layer 102 is confined in the recesses of 106 and 108. Besides the conductive pad 122, a portion of the conductive layer 102 is also in contact with the dielectric layer 104. In other words, the top surface 102a of conductive layer 102 is concurrently in contact with the conductive material of conductive pad 122 and the dielectric material of dielectric layer 104.

Another correlation to be mentioned in the present disclosure is the relative position between the pad 122 and the TSV 103. Even though the pad 122 is non-contact with the TSV 103, however, from a top-down perspective, the relative position between the pad 122 and the TSV 103 is also a factor to be considered in the present disclosure. Because the recesses 106 and 108 in FIG. 6 are not fully resided within the boundary of TSV 103, the contact points between the pad 122 and conductive layer 102 are also not fully resided within the boundary of TSV 103 from the top-down perspective in FIG. 4. Therefore, in some embodiments, the pad 122 is over and fully covering the TSV 103 wherein an interposed conductive layer 102 is a connection therebetween. However, none of the contact points between the pad 122 and conductive layer 102 is fully inside the boundary of TSV 103. In other words, a fully inside contact point between the pad 122 and conductive layer 102 is excluded from the overlapped area between the pad 122 and TSV 103 from the top-down perspective.

Referring to FIG. 4A, in some embodiments, another dielectric layer 104a is distinguishable between the substrate 100 and dielectric layer 104. The dielectric layer 104a may be comprised of a dielectric material, such as silicon oxide, silicon nitride, silicon oxynitride, high-k or low-k dielectric material, other suitable dielectric material, and/or combinations thereof. Conductive layer 102 is surrounded by the dielectric layer 104a. For some other embodiments, the border lines between dielectric layer 104 and dielectric layer 104a might be omitted for simplification.

Figure 5:
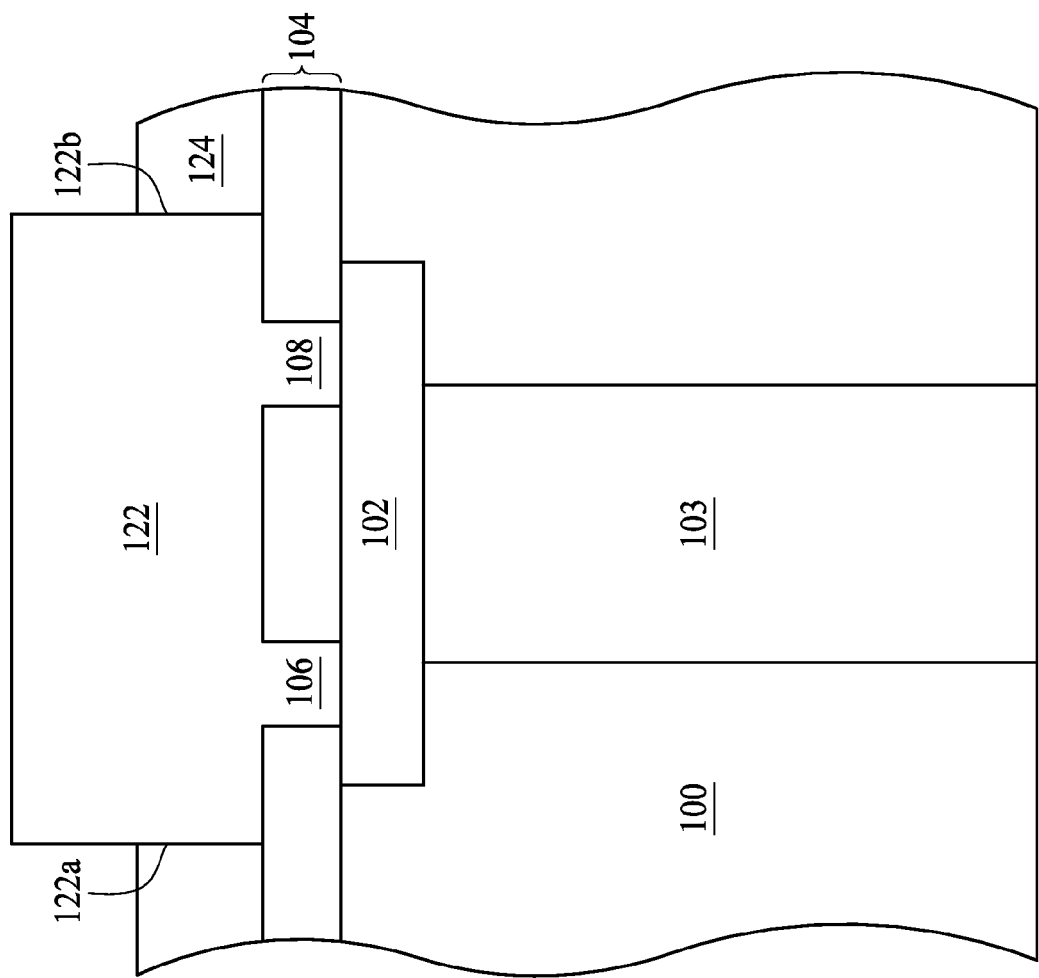

Referring to FIG. 5, a protective layer 124 is formed to cover the surface of the dielectric layer 104 and a portion of side walls 122a and 122b of the pad 122. The protective layer 124 may be composed of insulating materials. The protective layer is comprised of any suitable material, including silicon oxide, sapphire, other suitable insulating materials, and/or combinations thereof. An exemplary protective layer may include a buried oxide layer (BOX). The protective layer is formed by any suitable process, such as implantation (e.g., SIMOX), oxidation, deposition, and/or other suitable processes. Please note that it is not intended for the invention to be limited to the examples shown herein. The protective layer 124 covers the edge of the pad 122, thus strengthening the bonding of the pad 122, especially for the corner of the pad 122. Once the protection layer 124 has been deposited, the following wire bonding operation can be carried out in subsequent operations so as to electrically connect the external circuit and the pad 122 by forming the welding wire (not shown). The subsequent operations further include a molding operation to complete the semiconductor device packaging process. Since the subsequent wire bonding and molding operations are known to those skilled in the art, and the present disclosure is focused on the operations and structures before the wire bonding and molding operations, the details regarding the subsequent operations will not be described herein for brevity.

Figure 7:
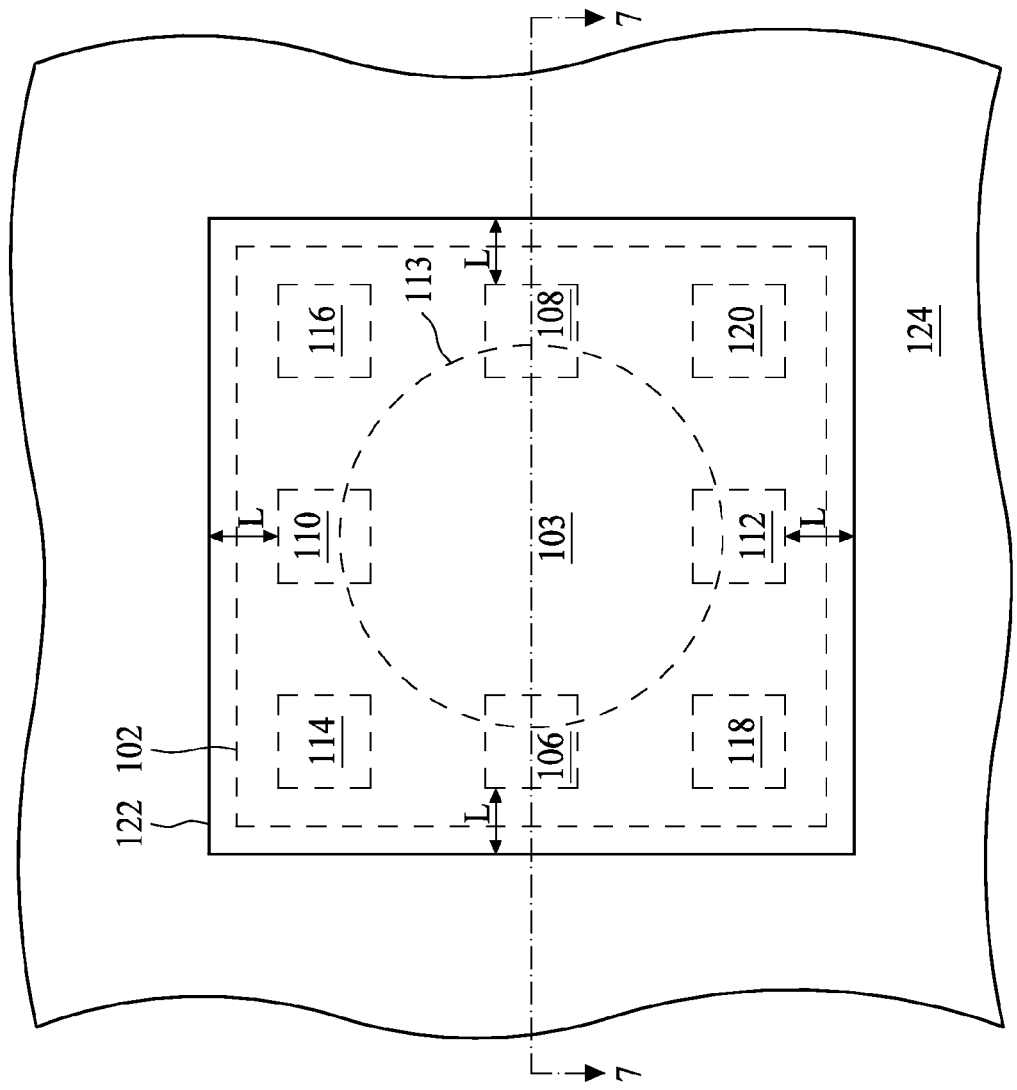
FIG. 7 is a schematic top view of FIG. 5 according to an exemplary embodiment of the present disclosure.

It should be noted that unlike the conventional art in which the whole pad touches and is electrically connected to the internal circuit, in the method of the present disclosure, only a part of the pad formed in the opening is utilized to electrically connect the whole pad to the internal circuit. Please refer to FIG. 5 in conjunction with FIG. 7. FIG. 7 is a schematic top view of FIG. 5 according to an exemplary embodiment of the present disclosure. Relatively, FIG. 5 is a cross-sectional schematic view of the semiconductor taken along lines 7-7 of FIG. 7. As shown in FIG. 7, none of the recesses are located inside the TSV 103 due to the location right above a central region of the TSV 103 bearing an extremely high stress induced by the structure of the deep TSV 103 and the thick pad 122. In order to prevent such a stress from affecting the entire connectivity between the pad 122 and the conductive layer 102, all the recesses 106-120 of the present disclosure are located away from the central region of the TSV 103 and at least to the location across the sidewalls of the TSV 103 as shown in FIG. 7.

Specifically, no more than about 50% of an opening area overlaps the footprint of the TSV 103 seen from the top view of FIG. 7. In this embodiment, less than about 50% of the area for each of the recesses 106, 108, 110 and 112 overlaps the TSV 103. In this way, the high stress induced by the deep TSV 103 and the thick pad 122 can be avoided from being transferred to the thick pad 122, wherein the peeling of the pad 122 can be affectively avoided.

In addition, during the subsequent wire bonding operation, the corner of the pad 122 generally bears a high stress due to the upward tension after wiring. The high stress is likely to be transferred from the edge of the pad 122 to the recesses 106-120 along the pad 122. The stress from the edge of the pad 122 may cause the connection portions in the recesses 106-120 to peel from the conductive layer 102, and pose a high risk of pad peeling, which is called delamination, and further damage the active circuit structure under the pad 122. In this embodiment, a longer distance between the edge of the thick pad 122 and the outermost side of the recesses 106-120 is disclosed to resolve the above mentioned issues. Specifically, a distance L between each edge of the thick pad 122 and the outermost edge of the recesses 106-120 is greater than about 2 μm as shown in FIG. 7. In some embodiments, a ratio of the distance L and the thickness of the thick pad 122 may be from about 0.2 to about 2.

When the same tensile stress testing conditions are applied in the examples of FIG. 7, it may be observed that peeling of an aluminum pad may be significantly reduced in the exemplary semiconductor device of FIG. 7 as compared to the prior art semiconductor devices. Accordingly, the stability of the electrical and mechanical bond between the aluminum pad and the underlying conductive layer can be improved using the exemplary semiconductor device of FIG. 7. Therefore, the exemplary semiconductor device of FIG. 7 has improved reliability as compared to prior art semiconductor devices.

Moreover, compared with the method of the conventional art, the process of the present disclosure is not complicated. Practically no additional operation or mask is required in the present disclosure. The structure for preventing the pad peeling of an embodiment of the present invention is illustrated as follows.

Figure 8:
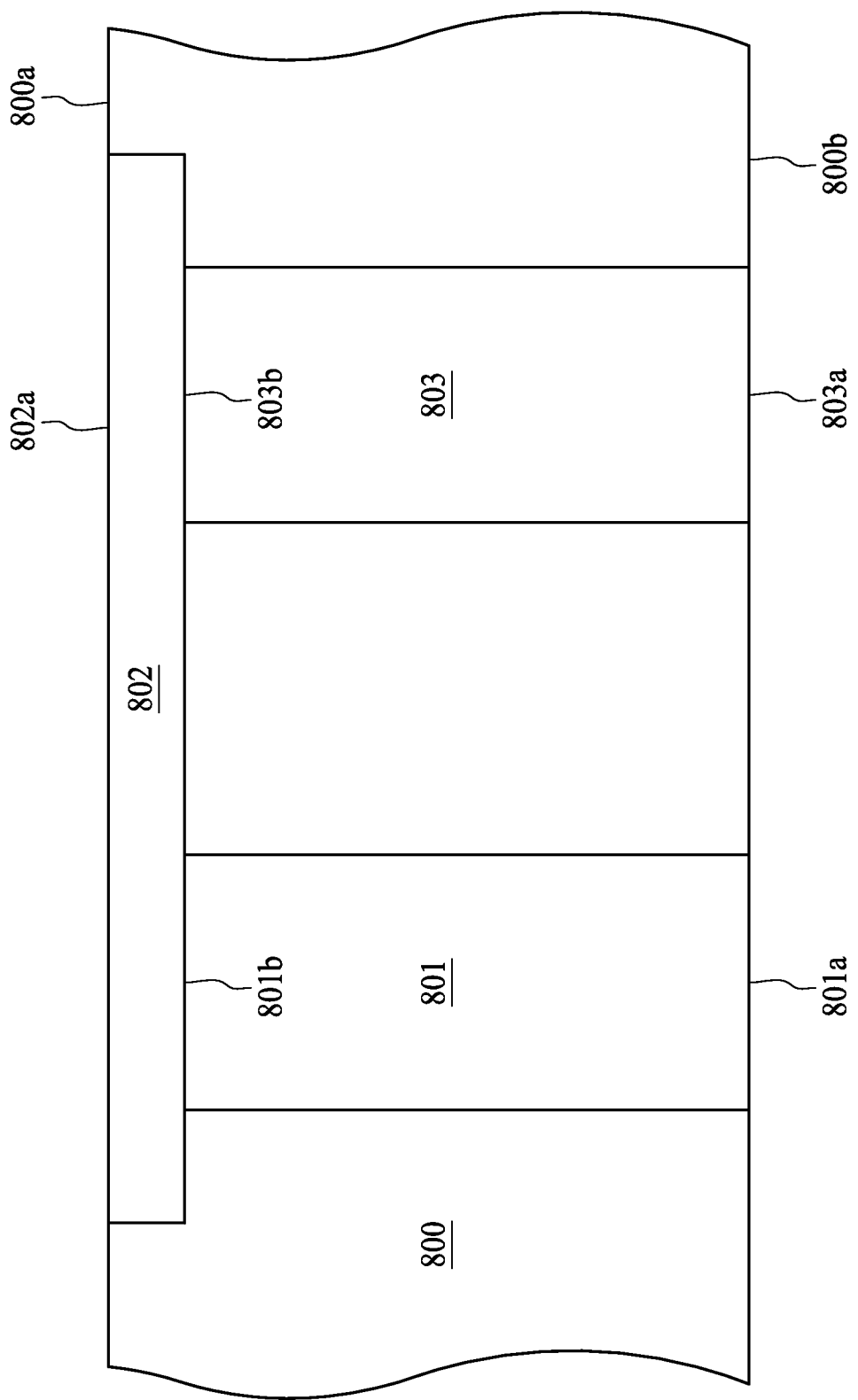
FIGS. 8-12 are cross-sectional schematic views for illustrating a flow for fabricating a semiconductor device with an anti-pad peeling structure according to another embodiment of the present disclosure.

FIGS. 8-12 are cross-sectional schematic views for illustrating a flow for fabricating a semiconductor device with an anti-pad peeling structure according to another embodiment of the present disclosure. In FIG. 8, a semiconductor substrate 800 is provided, in which an active circuit structure has been formed. The substrate 800 is composed of materials that are the same or similar to the substrate 100. It should be appreciated that in order to simplify the drawing, only the conductive layer 802 of the active circuit structure is depicted in FIG. 8 in a rectangular shape, and not all of the devices in the active circuit structure are shown. It should be acknowledged by those skilled in the art that the active circuit structure includes, for example, a plurality of semiconductor components and a plurality of semiconductor metal interconnects. In the present disclosure, the conductive layer 802 represents a layer in the active circuit structure in the semiconductor substrate 800. The conductive layer 802 is exposed from a top surface 800a of the semiconductor substrate. The conductive layer 802 provides a surface 802a as an electrical contact terminal for any connection with a component external to the semiconductor substrate 800. In some embodiments, the conductive layer 802 is in an uppermost level of the active circuit structure.

The conductive layer 802 is preferably comprised of copper and has a thickness of about 5 KA to 10 KA. The conductive layer 802 is formed over and electrically connected to TSVs 801 and 803. The TSVs 801 and 803 longitudinally pass through the semiconductor substrate 800. In this embodiment, the TSVs are composed of a copper material having superior conductivity. One end 801a of the TSV 801 and one end 803a of the TSV 803 are exposed from an external surface 800b of the substrate 800. The external surface 800b is opposite to surface 800a. The exposed ends 801a and 803a are designed to be connected to one or more components or circuits external to the substrate 800. The other end 801b of the TSV 801 and 803b of the TSV 803, which is opposite to the ends 801a and 803a respectively, are in contact with the conductive layer 802. The TSVs 801 and 803 and conductive layer 802 forms a conductive path inside and through the substrate 800. Therefore, an electrical communication between any circuitry over surface 800a or any circuitry under surface 800b can be achieved. So as to make an interconnection in a 3D package.

Figure 9:
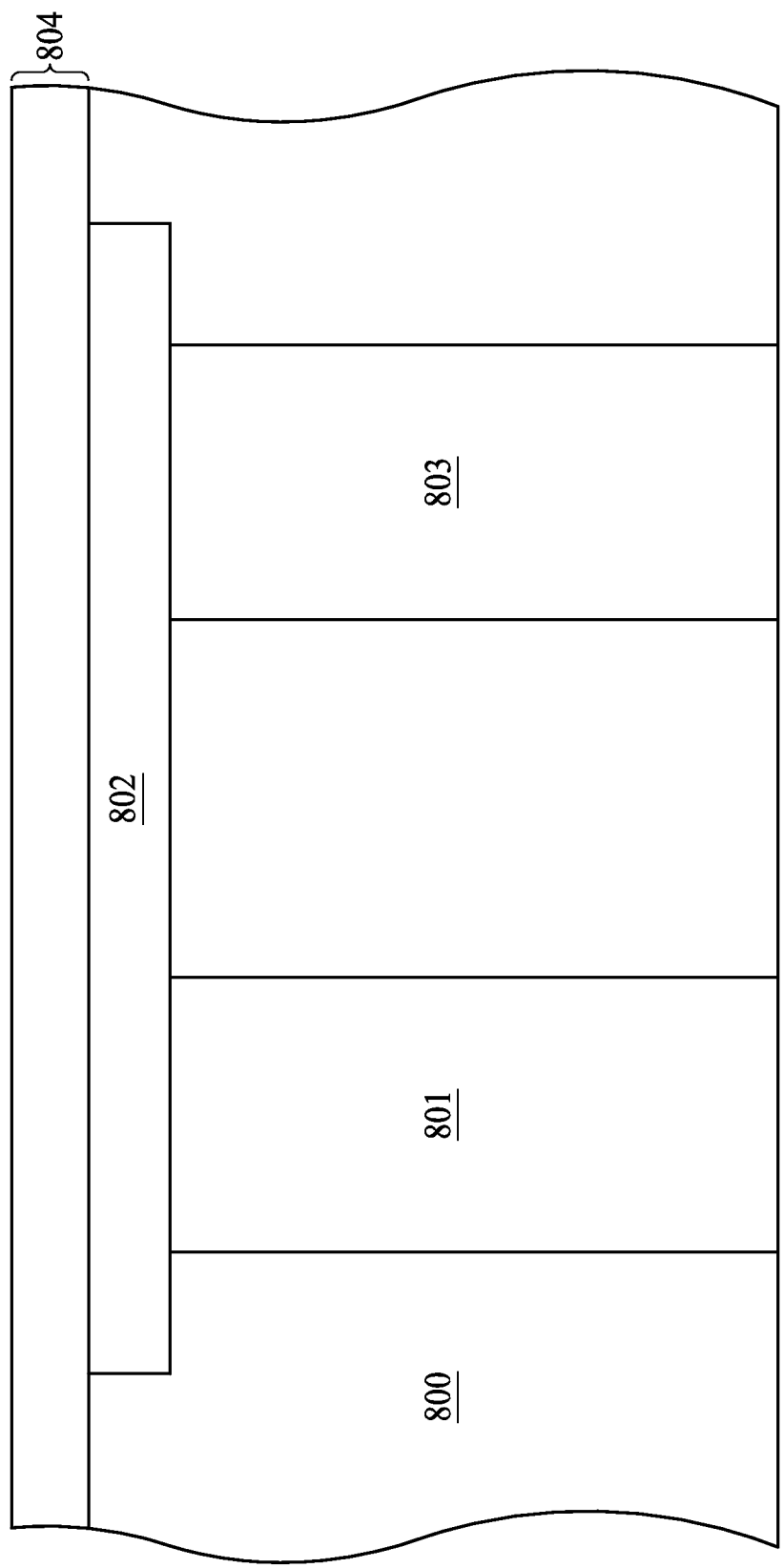

Referring to FIG. 9, a dielectric layer 804 is formed on the semiconductor substrate 800 and the conductive layer 802 by any suitable process. The dielectric layer 804 may be comprised of a dielectric material, such as silicon oxide, silicon nitride, silicon oxynitride, high-k dielectric material, other suitable dielectric material, and/or combinations thereof.

Figure 10:
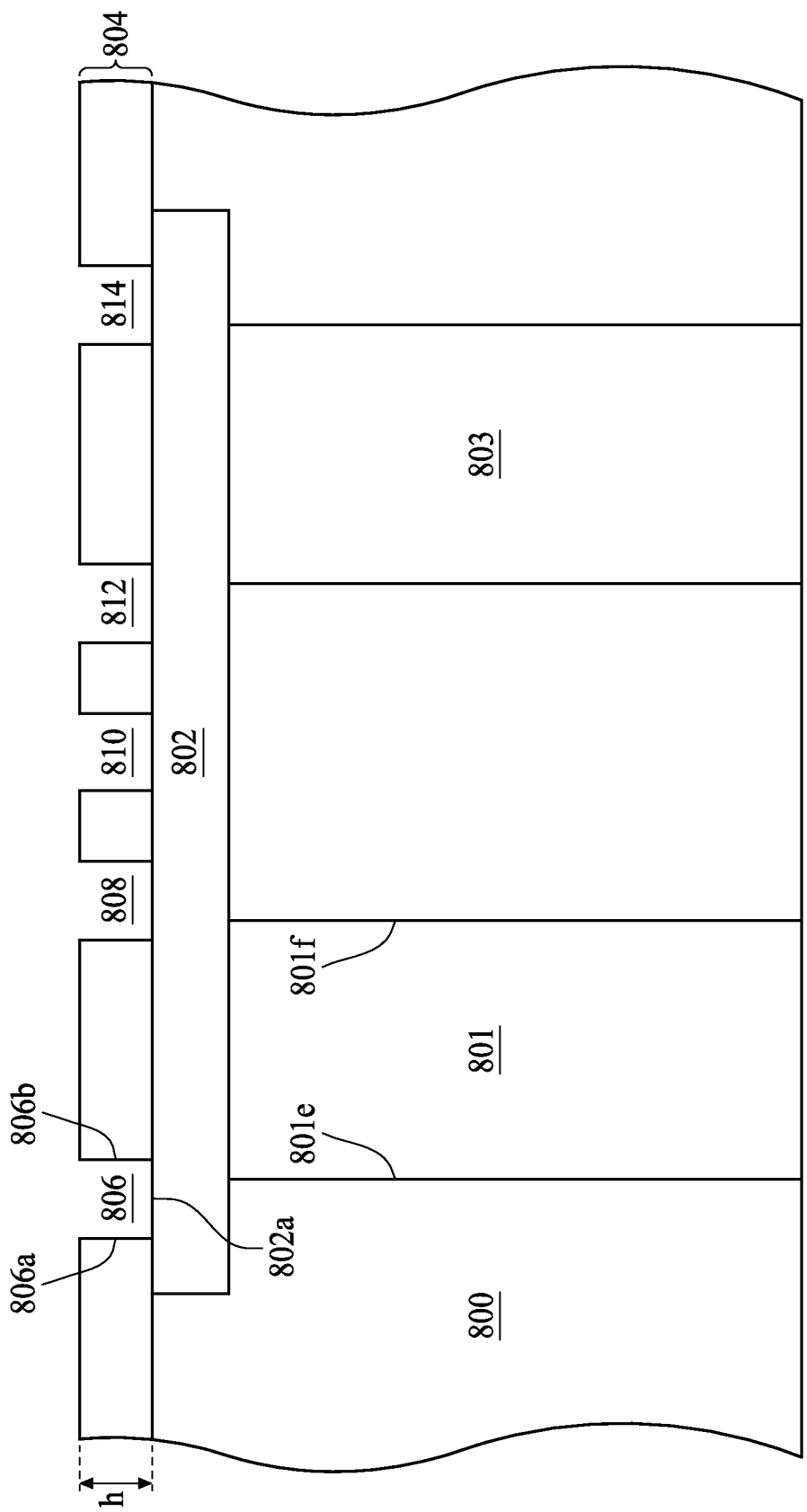

Recesses 806-814 are formed in the dielectric layer 804 as shown in FIG. 10. The recesses 806, 808, 812 and 814 are formed in the dielectric layer 804. Each recess has a depth h measured substantially along the longitudinal direction of the TSVs 801 and 803. Due to some deviations during the manufacturing operations, there may be a slight variation between different recesses. However, each recess has a corresponding depth h greater enough to expose at least a portion of the surface 802a. Each of the TSVs 801 and 803 has at least one recess disposed above (two recesses in the subject embodiment for each TSV) but the recess is partially overlapping with the corresponding underpaid TSV. Take recess 806 as an example, the recess 806 is over the TSV 801 but has a surface 806a laterally extruding over a sidewall 801e of TSV 801. On the other side, the surface 806b of the recess 806 is overlaid the TSV 801 and laterally within the boundary of sidewall 801e. The recess 808 is positioned above an opposite sidewall 801f of the TSV 801 in a way similar to the recess 806. Furthermore, the recesses 812 and 814 are position above two sidewalls of the TSV 803 in a way similar to the recesses 806 and 808.

Figure 13:
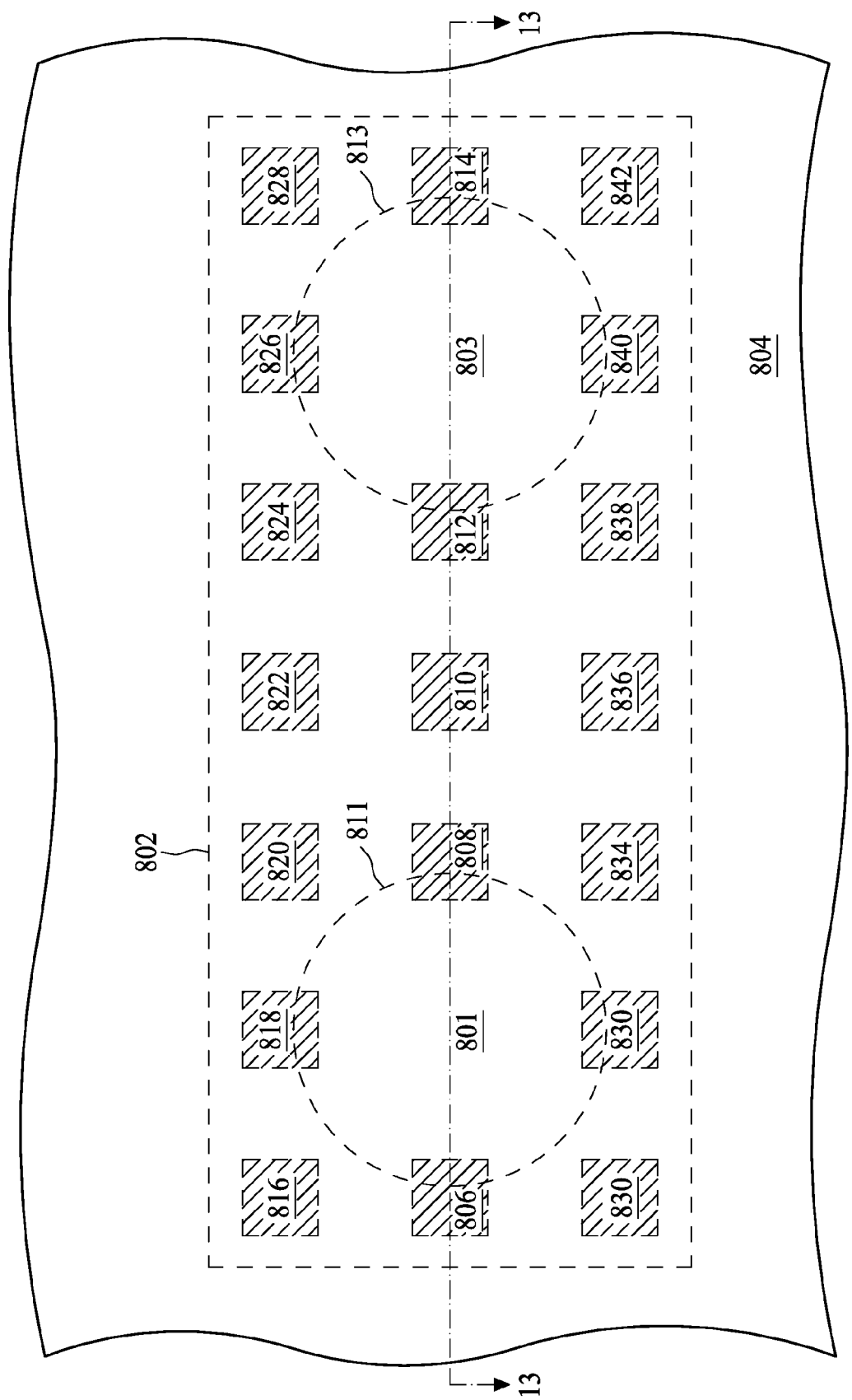
FIG. 13 is a schematic top view of FIG. 10 according to another embodiment of the present disclosure.

Still referring to FIG. 10 in conjunction with FIG. 13, FIG. 13 is a schematic top view of FIG. 10 according to another embodiment of the present disclosure. FIG. 10 is a cross-sectional schematic view of the semiconductor taken along lines 13-13 of FIG. 13. As shown in FIG. 13, the recesses 806-842 are substantially quadrilateral shaped, and a boundary 811 of the TSVs 801 and a boundary 813 of the TSVs 803 are approximately circular. Conductive layer 802 in the recesses is exposed (the shaded portion). The boundaries 811 and 813 are depicted in a dotted line because it is covered by the conductive layer 102. Specifically, the recesses 806, 808, 812, 814, 818, 826, 832 and 840 are formed to be overlapped with a portion of the sidewall of the TSVs 801 and 803). Recesses 810, 816, 820, 822, 824, 828, 830, 834, 836, 838 and 842 are formed outside the boundaries 811 and 813 of the TSVs 801 and 803 and non-overlapped with the TSVs 801 and 803 when being seen from the top view. Therefore, neither the partially overlapped recess (such as 806, or 812) nor the non-overlapped recess (such as 816, or 842) is formed fully inside the boundaries 811 and 813.

The method of forming the recesses 806-842 is, for example, by forming a patterned photoresist layer (not shown) on the dielectric layer 804 of FIG. 9. The pattern of the patterned photoresist layer exposes eight substantially quadrilateral shaped regions of the surface of the dielectric layer 804. Then, the patterned photoresist layer is used as a mask to etch the exposed dielectric layer 804. The etch stops at the conductive layer 802 and the formation of the recesses 806-842 is performed. In some other embodiments, the recesses 806-842 of FIG. 13 may be in other types of shapes. For example, a shape of the recesses 806-842 may be polygon. In another example, a shape of the recesses 806-842 may be circular or oval.

Figure 11:
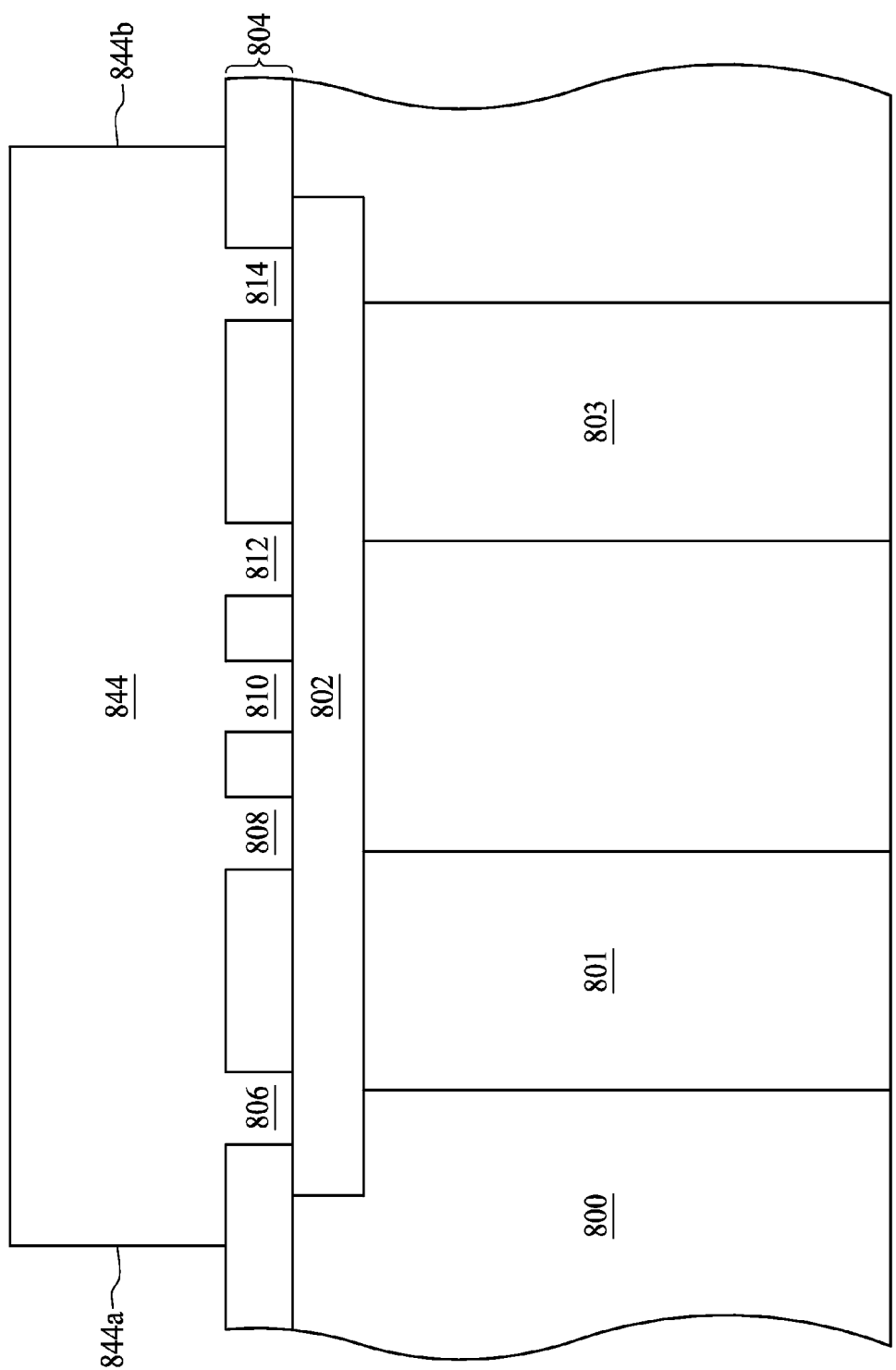

Referring to FIG. 11, a pad 844 is formed above the semiconductor substrate 800 to electrically connect the conductive layer 802. The pad 844 covers the dielectric layer 804 and extends to the recesses 806-842 (only the recesses 806-814 are depicted in FIG. 11 due to the cross-sectional perspective). The pad 844 may fully or partially overlap the conductive layer 802 and the TSVs 801 and 803. In this embodiment, the pad 844 completely covers the area of the TSVs 801 and 803 when being seen from a top-down perspective. Please note that the pad 844 may fully or at least partially fills up the recesses 806-814. In this embodiment, the pad 844 is a thick pad, for example, and the pad 844 has a thickness of about 20 KA to about 40 KA. The pad 844 may include a metal layer comprised of, for example, aluminum. The method of forming the pad 844 is, for example, by forming an aluminum metal layer (not shown) above the semiconductor substrate 800 so as to cover the entire dielectric layer 804 and fill up the recesses 806-842. Then, a patterned photoresist layer (not shown) is formed on the aluminum metal layer so as to expose the aluminum metal layer above the desired position approximately above of the corresponding conductive layer 802. Thereafter, the patterned photoresist layer is used as a mask to etch the exposed aluminum metal layer, thus completing the formation.

The portions of the pad 844 formed in the recesses 806-842 provide a function to electrically connect to the conductive layer 802 through portions of the pad 844 in the recesses 806-842.

Figure 12:
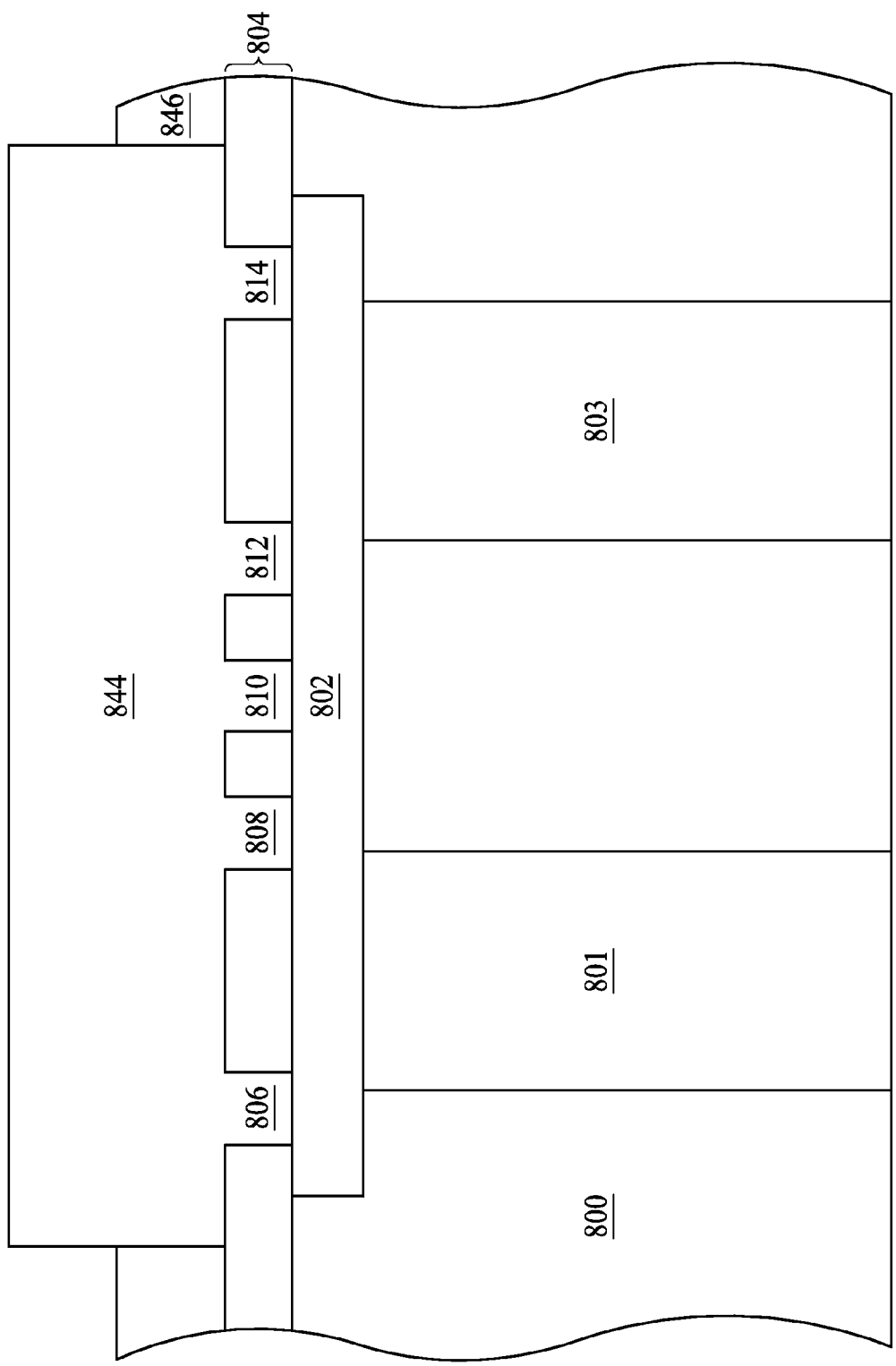

Referring to FIG. 12, a protective layer 846 is formed to cover the surface of the dielectric layer 804 and a portion of side walls 844a and 844b of the pad 844. The protective layer 846 may be composed of insulating materials. The protective layer is comprised of any suitable material, including silicon oxide, sapphire, other suitable insulating materials, and/or combinations thereof. An exemplary protective layer may include a buried oxide layer (BOX). The protective layer is formed by any suitable process, such as implantation (e.g., SIMOX), oxidation, deposition, and/or other suitable processes. Please note that it is not intended for the invention to be limited to the examples shown herein. The protective layer 846 covers the edge of the pad 844, thus strengthening the bonding of the pad 844, especially for the corner of the pad 844. Once the protection layer 846 has been deposited, the following wire bonding operation can be carried out in subsequent operations so as to electrically connect the external circuit and the pad 844 by forming the welding wire (not shown).

Figure 14:
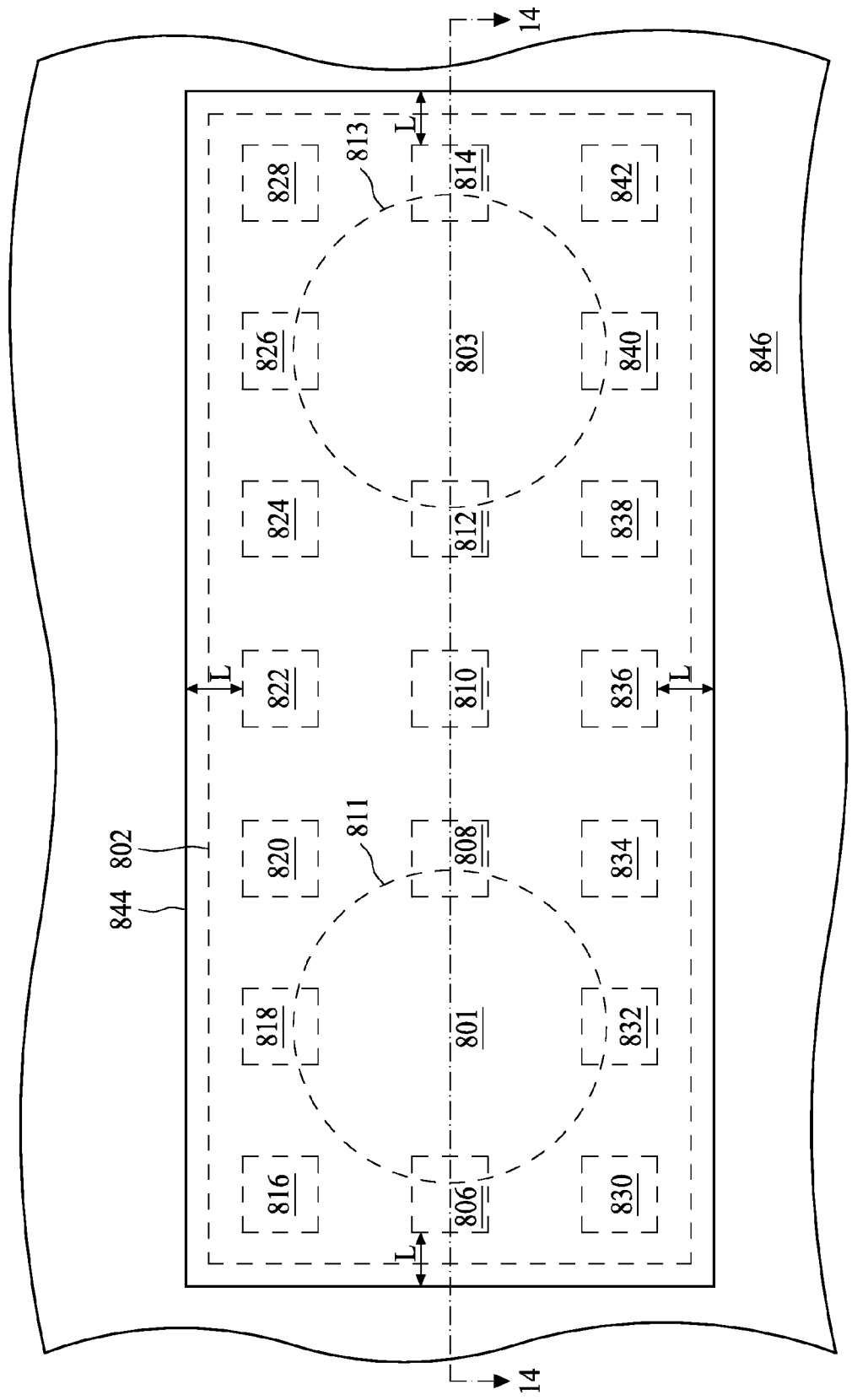
FIG. 14 is a schematic top view of FIG. 12 according to another embodiment of the present disclosure.

Please refer to FIG. 12 in conjunction with FIG. 14. FIG. 14 is a schematic top view of FIG. 12 according to another embodiment of the present disclosure. Relatively, FIG. 12 is a cross-sectional schematic view of the semiconductor taken along lines 14-14 of FIG. 14. As shown in FIG. 14, none of the recesses are located inside the TSVs 801 and 803 due to the location right above a central region of the TSVs 801 and 803 bearing an extremely high stress induced by the structure of the deep TSVs 801 and 803 and the thick pad 844. In order to prevent such a stress from affecting the entire connectivity between the pad 844 and the conductive layer 802, all the recesses 806-842 of the present disclosure are located away from the central region of the TSVs 801 and 803 and at least to the location across the sidewalls of the TSVs 801 and 803 as shown in FIG. 14.

Similar to FIG. 7, less than about 50% of the area for each of the recesses 806, 808, 812, 814, 818, 826, 832 and 840 overlaps the TSVs 801 and 803. In this way, the high stress induced by the deep TSVs 801 and 803 and the thick pad 844 can be avoided from being transferred to the thick pad 844, wherein the peeling of the pad 844 can be affectively avoided. In addition, a distance L between the outermost side of the edge of the thick pad 844 and the outermost side of the recesses 806, 814, 816, 818, 820, 822, 824, 826, 828, 830, 832, 834, 836, 838, 840 and 842 is greater than about 2 μm as shown in FIG. 14. In some embodiments, a ratio of the distance L and the thickness of the thick pad 844 may be from about 0.2 to about 2.

Figure 15:
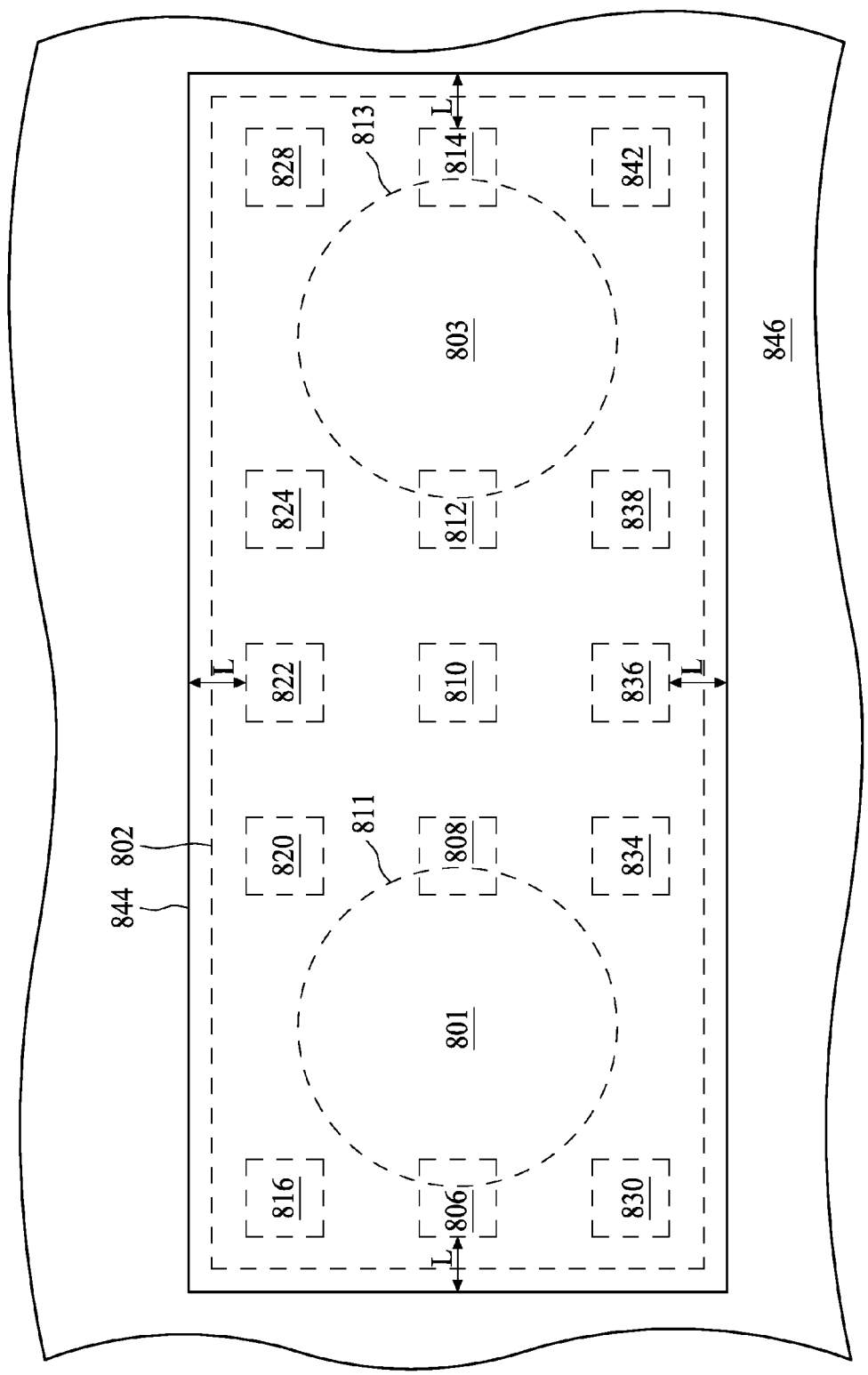
FIG. 15 is a schematic top view of FIG. 12 according to still another embodiment of the present disclosure.

Compared with the single TSV-to-one pad structure shown in FIG. 5, the double TSV-to-one pad structure has an extra tensile stress formed over the pad portion at the recesses located over the edge of the TSVs 801 and 803 near the wider length of the pad 844, i.e. the recesses 818, 826, 832 and 840 of FIG. 14. FIG. 15 is a schematic top view of FIG. 12 according to still another embodiment of the present disclosure. As can be seen from FIG. 15, the recesses located over the edge of the TSVs 801 and 803 near the wider length of the pad 844 are removed in order to avoid the effect of the extra tensile stress. When the same tensile stress testing conditions are applied in the examples of FIG. 15, it may be observed that peeling of an aluminum pad is further reduced compared to FIG. 14. Accordingly, the stability of the electrical and mechanical bond between the aluminum pad and the underlying conductive layer can be further improved using the semiconductor device of FIG. 15 when one pad structure is put over a TSV row.

Some embodiments of the present disclosure provide a semiconductor device with an anti-pad peeling structure. The semiconductor device includes a semiconductor substrate including a Through Substrate Via (TSV); a dielectric layer on the semiconductor substrate and including a plurality of recesses therein; and a pad above the semiconductor substrate to cover a portion of the dielectric layer and extend to the recesses; wherein from a top-down perspective the pad fully covers the TSV, and a distance between each edge of the pad and the outermost edge of the recesses is greater than a specified length.

In some embodiments of the present disclosure, the method further includes a conductive layer on the TSV; wherein the pad is electrically connected to the conductive layer through the recesses so that the pad is electrically connected to the TSV.

In some embodiments of the present disclosure, the method further includes a protective layer on the dielectric layer to cover at least a portion of sidewalls of the pad.

In some embodiments of the present disclosure, the conductive layer includes copper (Cu).

In some embodiments of the present disclosure, the specified length is about 2 μm.

In some embodiments of the present disclosure, when being seen from the top view, for each opening that overlaps the TSV, an overlap ratio is less than a specified ratio of an area of the opening.

In some embodiments of the present disclosure, the specified ratio is about 50%.

In some embodiments of the present disclosure, the pad includes aluminum (AL).

Some embodiments of the present disclosure provide a semiconductor device with an anti-pad peeling structure. The semiconductor device includes a semiconductor substrate including a Through Substrate Via (TSV); a conductive layer on the TSV; a dielectric layer on the semiconductor substrate and including a plurality of recesses therein; and a pad above the semiconductor substrate to cover a portion of the dielectric layer; wherein the pad extends to the plurality of recesses, and a plurality of contact points are confined in the recesses between the pad and the conductive layer, and each of the contact points is at least partially excluded from a boundary of the TSV when being seen from a top-down perspective.

In some embodiments of the present disclosure, the pad and the conductive layer include different metals.

In some embodiments of the present disclosure, the pad is electrically connected to the TSV through the contact points and the conductive layer.

In some embodiments of the present disclosure, at least a portion of the recesses partially overlaps the TSVs when being seen from the top-down perspective.

In some embodiments of the present disclosure, when being seen from the top-down perspective, a distance between each edge of the pad and the outermost edge of the contact point is greater than about 2 μm.

In some embodiments of the present disclosure, when being seen from the top-down perspective, for each contact point that overlaps the TSV, an overlap ratio is less than about 50% of an area of the contact point.

In some embodiments of the present disclosure, the conductive layer is over and fully covering the TSV.

In some embodiments of the present disclosure, the pad is over and fully covering the TSV.

In some embodiments of the present disclosure, the conductive layer includes copper (Cu), and the pad includes aluminum (AL).

Some embodiments of the present disclosure provide a method for fabricating a semiconductor device with an anti-pad peeling structure. The method includes: providing a semiconductor substrate including a Through Substrate Via (TSV); forming a dielectric layer on the semiconductor substrate; forming a plurality of recesses in the dielectric layer; and forming a pad above the semiconductor substrate to cover at least a portion of the dielectric layer and fill the recesses; wherein at least a portion of the pad overlaps the TSV when being seen from a top view.

In some embodiments of the present disclosure, the method further includes forming a conductive layer on the TSV; wherein the pad is electrically connected to the conductive layer through the recesses so that the pad is electrically connected to the TSV.

In some embodiments of the present disclosure, the method further includes forming a protective layer on the dielectric layer to cover at least a portion of sidewalls of the pad.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device with an anti-pad peeling structure, comprising:
    a semiconductor substrate comprising a Through Substrate Via (TSV) including a conductive portion;
    a dielectric layer on the semiconductor substrate and comprising a plurality of recesses therein; and
    a pad above the semiconductor substrate to cover a portion of the dielectric layer and extend to the recesses,
    wherein from a top-down perspective the pad fully covers the TSV, and a distance between an edge of the pad and the outermost edge of the recesses is greater than a specified length;
    wherein a plural portion of the plurality of the recesses has planar boundaries that partially overlap that of the conductive portion of the TSV; and for the recesses that partially overlap the conductive portion of the TSV, an overlap ratio is less than a specified ratio of an area of the recess.

2. The semiconductor device of claim 1, further comprising:
    a conductive layer on the TSV;
    wherein the pad is extended to the conductive layer through the recesses so that the pad is electrically connected to the TSV.

3. The semiconductor device of claim 2, wherein the conductive layer comprises copper (Cu).

4. The semiconductor device of claim 1, further comprising:
    a protective layer on the dielectric layer to cover at least a portion of a sidewall of the pad.

5. The semiconductor device of claim 1, wherein the specified length is about 2 μm.

6. The semiconductor device of claim 1, wherein the specified ratio is about 50%.

7. The semiconductor device of claim 1, wherein the pad comprises aluminum (Al).

8. A semiconductor device, comprising:
    a semiconductor substrate comprising a Through Substrate Via (TSV);
    a conductive layer on the TSV;
    a dielectric layer on the semiconductor substrate and defining a plurality of recesses therein, the dielectric layer being over the conductive layer; and
    a pad above the semiconductor substrate to cover a portion of the dielectric layer;
    wherein the pad extends into the plurality of recesses, a plurality of contacts is confined in the recesses between the pad and the conductive layer, and a planar profile of each of the contacts at least partially offsets that of the TSV when being seen from a top-down perspective.

9. The semiconductor device of claim 8, wherein the pad and the conductive layer comprise different metals.

10. The semiconductor device of claim 8, wherein the pad is electrically connected to the TSV through the contacts and the conductive layer.

11. The semiconductor device of claim 8, wherein at least a portion of the recesses partially overlaps the TSVs when being seen from the top-down perspective.

12. The semiconductor device of claim 11, wherein when being seen from the top-down perspective, for each contact that overlaps the TSV, an overlap ratio is less than about 50% of an area of the contact.

13. The semiconductor device of claim 8, wherein when being seen from the top-down perspective, a distance between each edge of the pad and the outermost edge of the contact is greater than about 2 μm.

14. The semiconductor device of claim 8, wherein the conductive layer is over and fully covering the TSV.

15. The semiconductor device of claim 8, wherein the pad is over and fully covering the TSV.

16. The semiconductor device of claim 8, wherein the conductive layer comprises copper (Cu), and the pad comprises aluminum (Al).

17. A method for fabricating a semiconductor device with an anti-pad peeling structure, comprising:
    providing a semiconductor substrate comprising a Through Substrate Via (TSV), the TSV including a conductive portion;
    forming a dielectric layer on the semiconductor substrate;
    forming a plurality of through holes in the dielectric layer; and
    forming a pad above the semiconductor substrate to cover at least a portion of the dielectric layer and fill the through holes;
    wherein at least a portion of the pad overlaps the TSV, more than one of the through holes have planar profiles that partially overlap that of the conductive portion of the TSV, and the planar profile of each of the through holes is at least partially excluded from that of the conductive portion of the TSV from a top-down perspective.

18. The method claim 17, further comprises:
forming a conductive layer on the TSV;
wherein the pad is extended to the conductive layer and through the dielectric layer so that the pad is electrically connected to the TSV.

19. The method of claim 17, further comprising:
forming a protective layer on the dielectric layer to cover at least a portion of sidewalls of the pad.

* * * * *